United States Patent
Ueta et al.

(10) Patent No.: US 10,319,821 B2
(45) Date of Patent: Jun. 11, 2019

(54) SILICON CARBIDE SUBSTRATE

(71) Applicant: SUMITOMO ELECTRIC INDUSTRIES, LTD., Osaka (JP)

(72) Inventors: Shunsaku Ueta, Hyogo (JP); Kyoko Okita, Hyogo (JP); Shin Harada, Hyogo (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/754,661

(22) PCT Filed: Jul. 21, 2016

(86) PCT No.: PCT/JP2016/071457
§ 371 (c)(1),
(2) Date: Feb. 23, 2018

(87) PCT Pub. No.: WO2017/064897
PCT Pub. Date: Apr. 20, 2017

(65) Prior Publication Data
US 2018/0254323 A1    Sep. 6, 2018

(30) Foreign Application Priority Data
Oct. 15, 2015   (JP) ................................ 2015-203995

(51) Int. Cl.
*C30B 23/02*      (2006.01)
*C30B 29/36*      (2006.01)
(Continued)

(52) U.S. Cl.
CPC ........ *H01L 29/1608* (2013.01); *C30B 23/025* (2013.01); *C30B 29/36* (2013.01); *H01L 21/02378* (2013.01)

(58) Field of Classification Search
CPC ....................... C30B 23/025; H01L 21/02378
See application file for complete search history.

(56) References Cited

U.S. PATENT DOCUMENTS

2012/0325196 A1* 12/2012 Okita ................. H01L 21/02021
125/2
2014/0295171 A1* 10/2014 Hori ........................ C30B 29/36
428/332
(Continued)

FOREIGN PATENT DOCUMENTS

| JP | H09-048688 | 2/1997 |
|----|------------|--------|
| JP | 2013-035705 | 2/2013 |
| WO | 2015/076037 | 5/2015 |

*Primary Examiner* — Farun Lu
(74) *Attorney, Agent, or Firm* — IPUSA, PLLC (57) ABSTRACT

A silicon carbide substrate includes a carbon-surface-side principal surface and a silicon-surface-side principal surface. The silicon carbide substrate has a diameter of 100 mm or greater and a thickness of 300 μm or greater. An off angle of the carbon-surface-side principal surface and the silicon-surface-side principal surface relative to a {0001} plane is smaller than or equal to 4°. A nitrogen concentration in the carbon-surface-side principal surface is higher than a nitrogen concentration in the silicon-surface-side principal surface, and a difference in Raman peak shift between the carbon-surface-side principal surface and the silicon-surface-side principal surface is smaller than or equal to 0.2 $cm^{-1}$.

4 Claims, 4 Drawing Sheets

(51) Int. Cl.
*H01L 21/02* (2006.01)
*H01L 29/16* (2006.01)

(56) References Cited

U.S. PATENT DOCUMENTS

2016/0236375 A1    8/2016  Hori et al.
2016/0257854 A1*   9/2016  Omori .................... B24B 37/00
2016/0312381 A1*  10/2016  Norimatsu ........ H01L 21/02378

* cited by examiner

SILICON CARBIDE SUBSTRATE

TECHNICAL FIELD

The present invention relates to a silicon carbide substrate.

The present application is based on and claims priority to Japanese Patent Application No. 2015-203995 filed on Oct. 15, 2015, the entire contents of which are herein incorporated by reference.

BACKGROUND ART

Patent Document 1 and Patent Document 2 disclose methods for sublimating and recrystallizing base powder on a seed crystal by arranging the base powder and the seed crystal in a crucible and heating the crucible by induction heating.
Patent Document 1: Japanese Laid-Open Patent Application Publication No. 9-48688
Patent Document 2: Japanese Laid-Open Patent Application Publication No. 2013-35705

SUMMARY OF THE INVENTION

A semiconductor substrate according to the present disclosure is a silicon carbide substrate, and includes a carbon-side principal surface and a silicon-side principal surface. The silicon carbide substrate has a 4H crystal structure and contains nitrogen. The carbon nitride substrate has a diameter of 100 mm or greater and a thickness of 300 μm or thicker. An off angle of the carbon-side principal surface and the silicon-side principal surface relative to a {0001} plane is smaller than or equal to 4°. Then, a nitrogen concentration in the carbon-side principal surface is higher than a nitrogen concentration in the silicon-side principal surface, and a difference between a Raman peak shift of the carbon-side principal surface and a Raman peak shift of the silicon-side principal surface is smaller than or equal to 0.2 $cm^{-1}$.

MODE OF CARRYING OUT THE INVENTION

Description of Embodiments of the Present Invention

To begin with, embodiments of the present invention are listed and described below. A semiconductor substrate of the present application is a silicon carbide substrate that includes a carbide-surface-side principal surface and a silicon-surface-side principal surface, and has a 4H crystal structure. An off angle of the carbon-surface-side principal surface and the silicon-surface-side principal surface relative to a {0001} plane is smaller than or equal to 4°. The diameter is greater than or equal to 100 mm. The thickness is thicker than or equal to 300 μm. Then, the nitrogen concentration in the carbon-surface-side principal surface is higher than the nitrogen concentration in the silicon-surface-side principal surface, and a difference between a Raman peak shift in the carbon-surface-side principal surface and a Raman peak shift in the silicon-surface-side principal surface is smaller than or equal to 0.2 $cm^{-1}$.

In silicon carbide substrates, warpages sometimes occur. The warpages of the silicon carbide substrates cause various problems in processes for manufacturing semiconductor devices using the silicon carbide substrates. More specifically, when a substrate is fixed by attraction in a photolithography process, the warpage can cause an attraction malfunction, for example. The inventors investigated the cause and its measures, and acquired the following findings.

The silicon carbide substrate can be manufactured, for example, by slicing a single-crystal silicon carbide obtained by sublimation technique. In the sublimation technique, the single-crystal silicon carbide grows in a condition where a temperature gradient is present in a growth direction. More specifically, in the single-crystal silicon carbide that grows by the sublimation technique, a growth temperature in a later growing region is higher than a growth temperature in a previously growing region. Thus, a lattice constant in the later growing region is greater than a lattice constant in the previously growing region. Moreover, in the growth of the 4H structure of silicon carbide, the carbon surface is frequently adopted as a growth surface.

When a silicon carbide substrate is manufactured by slicing the single-crystal silicon carbide obtained as is described above in a plane crossing with the growth direction, the lattice constant in a region close to the carbon-surface-side principal surface is greater than the lattice constant in a region close to the silicon-surface-side principal surface. In particular, when the single-crystal silicon carbide is sliced in a plane close to a direction perpendicular to the growth direction, for example, when the single-crystal silicon carbide is sliced so that an off angle of the carbide-surface-side principal surface and the silicon-surface-side principal surface relative to a {0001} plane is smaller than or equal to 4°, the difference between the lattice constant in the region close to the carbon-surface-side principal surface and the lattice constant in the region close to the silicon-surface-side principal surface increases. Thus, the difference in lattice constant causes an extra-half-plane that extends from the inside of the substrate toward the silicon-surface-side principal surface. As a result, a tensile stress occurs in the silicon-surface-side principal surface, and a compression stress occurs in the carbide-surface-side principal surface. The tensile stress and the compression stress cause the silicon carbide substrate to warp. In particular, when the diameter of the silicon carbide substrate is great, for example, when the diameter is greater than or equal to 100 mm, the generation of warpage becomes a problem. In response to this, according to the inventors' investigation, by creating a state in which the nitrogen concentration in the carbon-surface-side principal surface is higher than the nitrogen concentration in the silicon-surface-side principal surface, the above-described tensile stress and compression stress are reduced, and the warpage is inhibited.

In the silicon carbide substrate of the present application, the nitrogen concentration in the carbon-surface-side principal surface is higher than the nitrogen concentration in the silicon-surface-side principal surface, and the difference between the Raman peak shift in the carbon-surface-side principal surface and the Raman peak shift in the silicon-surface-side principal surface is made smaller than or equal to 0.2 cm$^{-1}$. Here, when the tensile stress is present, the Raman peak shifts to the plus side, whereas when the compassion stress is present, the Raman peak shifts to the minus side. In other words, in the silicon carbide substrate of the present application, the nitrogen concentration in the carbon-surface-side principal surface is set higher than the nitrogen concentration in the silicon-surface-side principal surface so that the tensile stress and the compression stress are reduced to the extent that the difference in Raman shift is smaller than or equal to 0.2 cm$^{-1}$. Thus, according to the silicon carbide substrate of the present application, the silicon carbide substrate capable of reducing the warpage can be provided.

In the above-mentioned silicon carbide substrate, the nitrogen concentration in the carbon-surface-side principal surface may be set higher than the nitrogen concentration in the silicon-surface-side principal surface by 1×10$^{16}$ cm$^{-3}$ or higher. By doing this, the generation of warpage can be reliably inhibited.

In the above-mentioned silicon carbide substrate, the difference between the nitrogen concentration in the carbon-surface-side principal surface and the nitrogen concentration in the silicon-surface-side principal surface may be lower than or equal to 1×10$^{17}$ cm$^{-3}$. Thus, the difference between the nitrogen concentration in the carbon-surface-side principal surface and the nitrogen concentration in the silicon-surface-side principal surface can be set appropriately.

In the above-mentioned silicon carbide substrate, the nitrogen concentration may increase with the decreasing distance from the carbon-surface-side principal surface in the thickness direction. By doing this, the decrease in warpage can be effectively achieved.

In the above-mentioned silicon carbide substrate, the diameter may be greater than or equal to 150 mm. The silicon carbide substrate of the present application is appropriate for a silicon carbide substrate having a great diameter likely to warp.

Here, of the {0001} plane (c-plane) of the hexagonal silicon carbide, the surface in which silicon atoms are arranged in its outermost surface is defined as a silicon surface, and the surface in which carbon atoms are arranged in its outermost surface is defined as a carbide surface. In the present application, the carbon-surface-side principal surface is a principal surface made of a crystal surface mainly composed of a carbon surface. The silicon-surface-side principal surface is a principal surface made of a crystal surface mainly composed of a silicon surface. Moreover, the Raman peak shift in the present application means a peak shift of a Raman peak of FTO(2/4)E2 (wave number 776 cm$^{-1}$).

Details of Embodiments of the Present Invention

Next, an embodiment of a silicon carbide substrate of the present invention is described below with reference to the accompanying drawings. It is to be noted that, in the explanation of the drawings, the same or corresponding components are given the same reference numerals, and explanations are not repeated.

Figure 1:
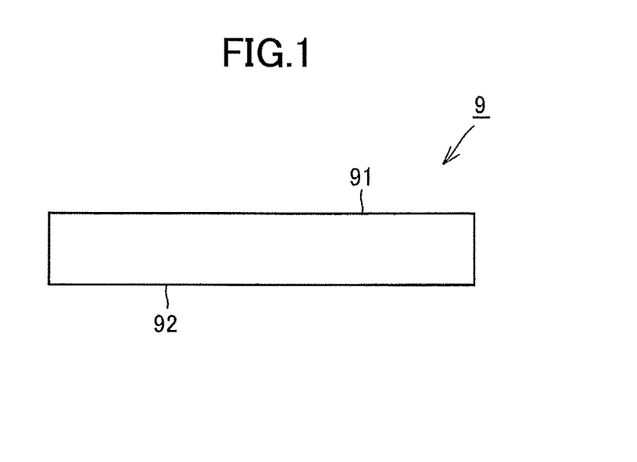
FIG. 1 is a schematic cross-sectional view illustrating an example of a structure of a silicon carbide substrate.

With reference to FIG. 1, a silicon carbide substrate 9 of the present embodiment includes a carbon-surface-side principal surface 91, and a silicon-surface-side principal surface 92. The silicon carbide substrate 9 is made of a single-crystal silicon carbide having a 4H crystal structure. An off angle of the carbon-surface-side principal surface 91 and the silicon-surface-side principal surface 92 relative to a {0001} crystal plane of the silicon carbide constituting the silicon carbide substrate 9 is smaller than or equal to 4°. In other words, the angle formed between the carbon-surface-side principal surface 91 and the silicon-surface-side principal surface 92, and the {0001} plane, is smaller than or equal to 4°.

Figure 2:
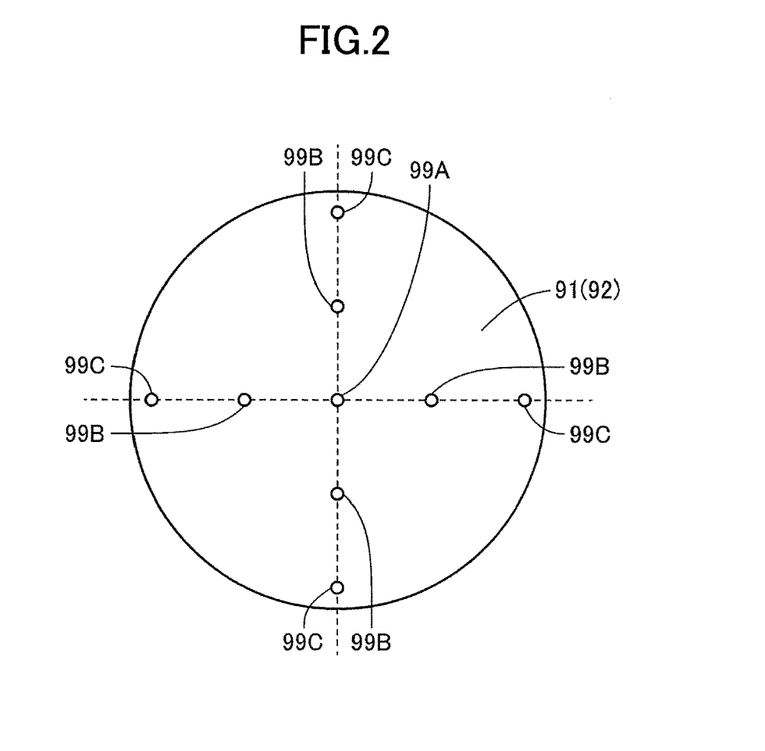
FIG. 2 is a schematic plan view illustrating an example of a structure of a silicon carbide substrate.

With reference to FIG. 1 and FIG. 2, the silicon carbide substrate 9 has a disc-like shape. The diameter of the silicon carbide substrate 9 is greater than or equal to 100 mm. The diameter of the silicon carbide substrate 9 may be greater than or equal to 150 mm. The silicon carbide substrate 9 having a greater diameter allows the manufacture of semiconductor devices using the silicon carbide substrate 9 (diodes, field-effect transistors and the like) to be efficiently performed. The thickness of silicon carbide substrate 9 (distance between the carbon-surface-side principal surface 91 and the silicon-surface-side principal surface 92) is greater than or equal to 300 μm. The thickness of the silicon carbide substrate 9 may be thinner than or equal to 600 μm.

Then, the nitrogen concentration in the carbon-surface-side principal surface 91 is higher than the nitrogen concentration in the silicon-surface-side principal surface 92, and the difference between the Raman peak shift in the carbon-surface-side principal surface 91 and the Raman peak shift in the silicon-surface-side principal surface 92 is smaller than or equal to 0.2 cm$^{-1}$. The nitrogen concentration in the carbon-surface-side principal surface 91 is higher than the nitrogen concentration in the silicon-surface-side principal surface 92, which causes the difference between the Raman peak shift in the carbon-surface-side principal surface 91 and the Raman peak shift in the silicon-surface-side principal surface 92 to be smaller than or equal to 0.2 cm$^{-1}$.

In the silicon carbide substrate 9 of the present embodiment, the nitrogen concentration in the carbon-surface-side principal surface 91 is set higher than the nitrogen concentration in the silicon-surface-side principal surface 92 so that a compression stress in the carbon-surface-side principal surface 91 and a tensile stress in the silicon-surface-side principal surface 92 decrease to the extent that the difference between the Raman peak shift in the carbon-surface-side principal surface 91 and the Raman peak shift in the silicon-surface-side principal surface 92 is smaller than or equal to 0.2 cm$^{-1}$. As a result, the silicon carbide substrate 9 of the present embodiment becomes a silicon carbide substrate whose warpage is reduced.

Here, the Raman peak shifts in the carbon-surface-side principal surface 91 and the silicon-surface-side principal surface 92 can be examined as follows, for example. With reference to FIG. 2, straight lines crossing perpendicularly to each other at the center of the carbon-surface-side principal surface 91 (or the silicon-surface-side principal surface 92) are assumed (see dotted lines in FIG. 2). Furthermore, intersection points of the straight lines with the periphery of the carbon-surface-side principal surface 91 (or the silicon-surface-side principal surface 92) are assumed. Then, Raman peak shifts are measured at a total of nine locations including four measurement regions 99C corresponding to points that are on the straight lines and are 10 cm inside the intersection points with the periphery, a measurement region 99A corresponding to the center, and four measurement regions 99B corresponding to the middle points of the measurement region 99A and the measurement regions 99C on the straight lines. Then, the average value thereof is made the Raman peak shift of the carbon-surface-side principal surface 91 (or the silicon-surface-side principal surface 92).

In the silicon carbide substrate 9, the nitrogen concentration in the carbon-surface-side principal surface 91 is preferably set higher than the nitrogen concentration in the silicon-surface-side principal surface 92 by $1 \times 10^{16}$ cm$^{-3}$ or higher. By doing this, the generation of warpage is more reliably inhibited. The difference between the nitrogen concentration in the carbon-surface-side principal surface 91 and the nitrogen concentration in the silicon-surface-side principal surface 92 may be $1 \times 10^{17}$ cm$^{-3}$ or lower.

Moreover, the nitrogen concentration preferably increases with the decreasing distance from the carbon-surface-side principal surface 91 and with the increasing distance from the silicon surface 92 in the thickness direction of the silicon carbide substrate 9. Thus, the decrease in warpage can be effectively achieved. The nitrogen concentration may increase with the decreasing distance from the carbon-surface-side principal surface 91 and with the increasing distance from the silicon surface 92 in the thickness direction of the silicon carbide substrate 9 in a step-by-step manner. Furthermore, the nitrogen concentration may continuously increase with the decreasing distance from the carbon-surface-side principal surface 91 and with the increasing distance from the silicon surface 92 in the thickness direction of the silicon carbide substrate 9.

Figure 4:
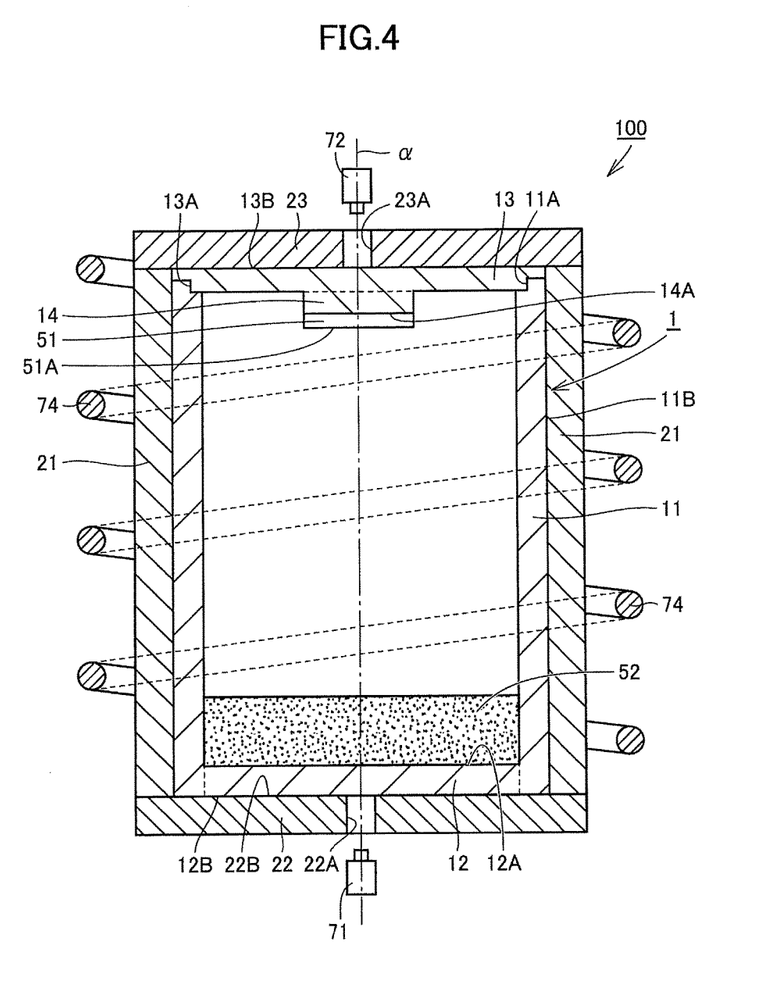
FIG. 4 is a schematic cross-sectional view for describing a method for manufacturing a silicon carbide substrate.
Figure 5:
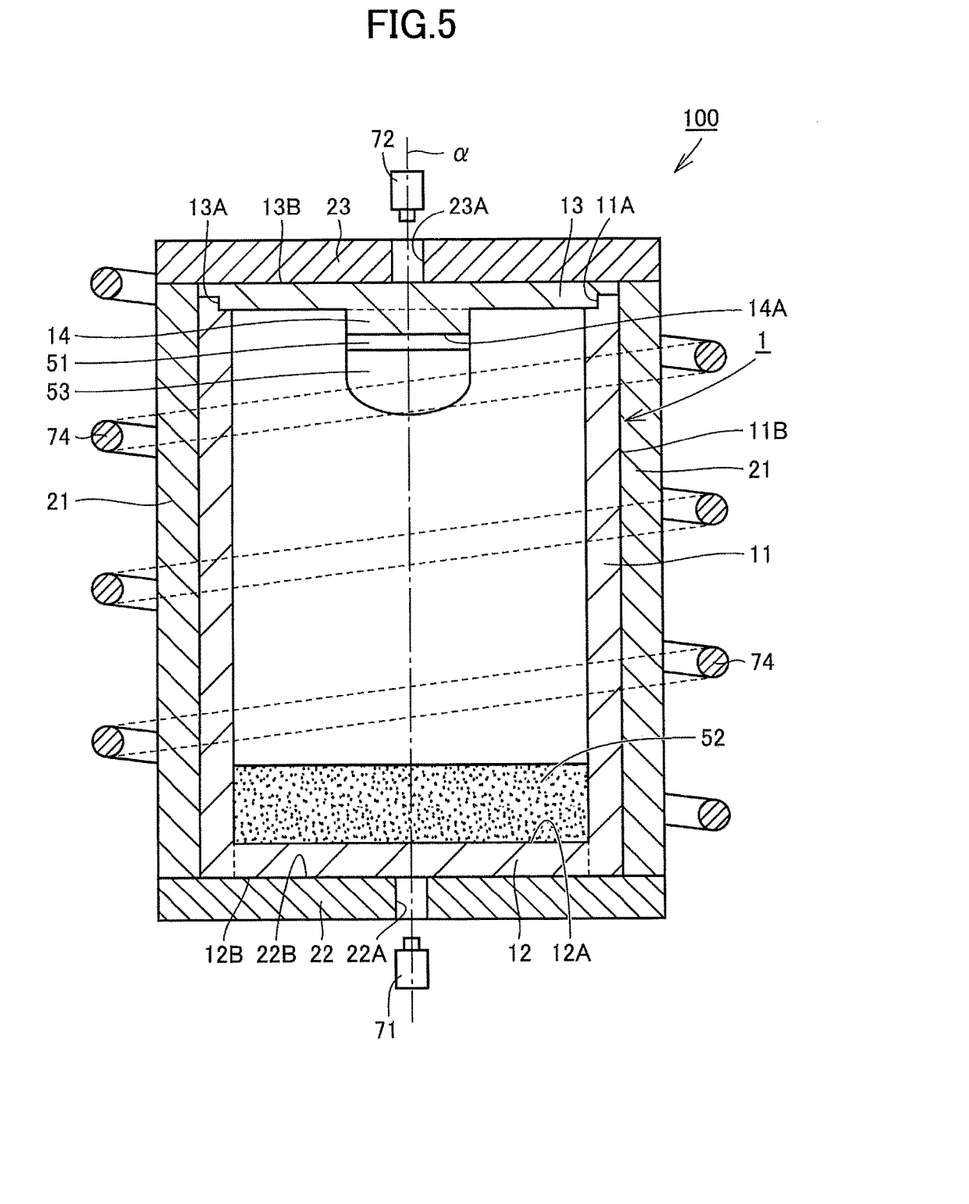
FIG. 5 is a schematic cross-sectional view illustrating a method for manufacturing a silicon carbide substrate.

Next, an example of method for manufacturing the silicon carbide substrate 9 according to the present embodiment is described below with reference to FIG. 3 through FIG. 5. In the method for manufacturing the silicon carbide substrate 9 of the present embodiment, a single crystal of silicon carbide is produced using a manufacturing device 100 of a single crystal illustrated in FIG. 4. With reference to FIG. 4, the manufacturing device 100 of the single crystal includes a crucible 1, heat insulating members 21, 22, 23, radiation thermometers 71, 72, and an induction heating coil 74.

The crucible 1 is made of a heatable material by induction heating, for example, graphite. The crucible 1 includes a peripheral wall part 11, a bottom wall part 12, and a lid part 13. The peripheral wall part 11 has a cylindrical shape. The bottom wall part 12 is connected to the peripheral wall part 11, and closes an opening on one side of the peripheral wall part 11. The lid part 13 is connected to the peripheral wall part 11, closes the opening on the other side of the peripheral wall part 11, and includes a holding part 14 to hold a seed crystal 51. In the present embodiment, the peripheral wall part 11 has a hollow cylindrical shape. The bottom wall part 12 has a disc-like shape. The peripheral wall part 11 and the bottom wall part 12 are formed integrally.

The lid part 13 is detachable from and attachable to the peripheral wall part 11. A lid-part coupling face 13A formed at an outer periphery of the lid part 13 and a peripheral-wall-part coupling face 11A famed at an inner periphery of the peripheral wall part 11 contact with each other, and thereby the lid part 13 is fixed to the peripheral wall part 11. For example, spiral thread grooves may be formed in the lid-part coupling face 13A and the peripheral-wall-part coupling face 11A. In a principal surface on one side of the lid part 13, a holding part 14 that protrudes from a central part of the principal surface is formed. The holding part 14 is positioned so as to contain a central axis α when the lid part 13 is attached to the peripheral wall part 11. The central axis α corresponds to a central axis of the peripheral wall part 11. At a leading end of the holding part 14, a holding surface 14A to hold a seed crystal is formed.

The heat insulating members 21, 22, 23 are made of, for example, molded heat insulating members. The heat insulating members 21, 22, 23 have a felt-like structure, for example, and are made of a fiber primarily composed of carbon. The heat insulating member 22 has a disc-like shape. The crucible 1 is arranged on the heat insulating member 22 so that an outer surface 12B of the bottom wall part 12 contacts a first principal surface 22B of the heat insulating member 22. The heat insulating member 21 has a hollow cylindrical shape. The heat insulating member 21 is arranged to entirely cover an outer surface 11B of the peripheral wall part 11 of the crucible 1. The insulating member 23 is arranged on an outer surface 13B of the lid part 13 so as to cover the outer surface 13B of the lid part 13 of the crucible 1. The crucible 1 is surrounded by the heat insulating members 21, 22, 23.

A through hole 22A that penetrates through the heat insulating member 22 in the thickness direction is formed in a region containing a central axis α in the heat insulating member 22. The radiation thermometer 71 is arranged to face the bottom wall part 12 of the crucible 1 via the through hole 22A. The temperature of the bottom wall part 12 is measured by the radiation thermometer 71, and the temperature of base powder 52 is gained. A through hole 23A that penetrates through the heat insulating member 23 in the thickness direction is formed in a region containing the central axis α in the heat insulating member 23. The radiation thermometer 72 is arranged to face the lid part 13 of the crucible 1 via the through hole 23A. The temperature of the lid part 13 is measured by the radiation thermometer 72, and the temperature of the seed crystal 51 is gained.

The induction heating coil 74 is arranged to surround the side of the outer surface 11B of the peripheral wall part 11 of the crucible 1 covered with the heat insulating member 21 in a spiral form. The induction heating coil 74 is connected to a power source (not illustrated in the drawings). The crucible 1 covered with the heat insulating members 21, 22, 23 is arranged in a region surrounded by the induction heating coil 74.

Next, a specific procedure for manufacturing a silicon carbide substrate is described below. With reference to FIG. 3, in the method for manufacturing the silicon carbide substrate in the present embodiment, a base powder arrangement process is performed as a process (S10). In this process (S10), with reference to FIG. 4, the base powder 52 is arranged so as to contact an inner surface 12A of the bottom wall part 12 of the crucible 1. More specifically, the base powder 52 of the silicon carbide is arranged in the crucible 1 in a state of removing the lid part 13.

Subsequently, a seed crystal arrangement process is performed as a process (S20). In this process (S20), the seed crystal 51 is arranged on the holding part 14. The seed crystal 51 is made of silicon carbide having a 4H crystal structure. More specifically, for example, the seed crystal 51 is attached to the holding part 14 of the lid part 13 removed from the peripheral wall part 11. The seed crystal 51 is attached to the holding surface 14A of the holding part 14. On this occasion, a growth surface 51A of the seed crystal 51 is made a carbon surface. Next, the lid part 13 is attached to the peripheral wall part 11. By doing this, the seed crystal 51 is arranged in the region crossing with the central axis α. Through the processes (S10) to (S20), the base powder 52 and the seed crystal 51 are arranged in the crucible 1.

Next, sublimation-recrystallization process is performed as a process (S30). In this process (S30), a single crystal 53 is caused to grow on the seed crystal 51 by sublimating and recrystallizing the base powder 52 on the seed crystal 51. More specifically, for example, the crucible 1 inside which the base powder 52 and the seed crystal 51 are arranged, for example, is covered with the heat insulating members 21, 22, 23. Furthermore, the crucible 1 covered with the heat insulating members 21, 22, 23 is arranged in the region surrounded by the induction heating coil 74 as illustrated in FIG. 4. Then, when a high frequency current flows through the induction heating coil 74, the crucible 1 is heated by induction heating.

On this occasion, the induction heating is performed so that the temperature of the base powder 52 becomes higher than the temperature of the seed crystal 51. As a result, the temperature gradient in which the side of the seed crystal 51 is low and the side of the base powder 52 is high along the central axis α that is the growth direction, is formed. More specifically, for example, the temperature of the seed crystal 51 can be made higher than or equal to 2000° C. and lower than or equal to 2300° C. The temperature of the base powder 52 can be made higher than or equal to 2100° C. and lower than or equal to 2400° C. The difference in temperature between the seed crystal 51 and the base powder 52 can be made higher than or equal to 100° C. and lower than or equal to 300° C. Moreover, the pressure in the crucible 1 can be made, for example, higher than or equal to 1 kPa and lower than or equal to 5 kPa. The inside of the crucible 1 is made an atmosphere filled with an inert gas such as argon. Furthermore, in the present embodiment, nitrogen gas is introduced into the crucible 1. The amount of introduction (flow rate) of nitrogen gas into the crucible 1 is adjusted so as to increase over time. The amount of introduction of nitrogen gas may be increased in a step-by-step manner or continuously.

Thus, the base powder 52 that is powder of silicon carbide sublimates, and a source gas that is silicon carbide in a gas state is generated. The source gas is supplied to the seed crystal 51. As a result, as shown in FIG. 5, the source gas recrystallizes on the seed crystal 51, and a single crystal 53 of silicon carbide having a 4H crystal structure grows on the seed crystal 51. Nitrogen is incorporated into the single crystal 53.

The presence of the above-mentioned temperature gradient causes a growth temperature of a region that has grown later to become higher than a growth temperature of a region that has grown previously in the single crystal 53 that is a single-crystal silicon carbide. Hence, when any measures are not taken, the lattice constant of the region that grows later becomes greater than the lattice constant of the region that has grown previously in the single crystal 53. In the present embodiment, the amount of nitrogen gas introduced into the crucible 1 increases over time as described above. Thus, in the single crystal 53, the nitrogen concentration in the region growing later becomes higher than the nitrogen concentration in the region growing previously. The higher the nitrogen concentration introduced into silicon carbide becomes, the smaller the lattice constant of silicon carbide becomes. As a result, the change of the lattice constant of the single crystal 53 is inhibited. Then, by maintaining this state, the single crystal 53 grows in the direction along the central axis α. Then, the heating ends when a preliminarily set heating period elapses, and the process (S30) ends.

Next, a slice process is performed as a process (S40). In this process (S40), the single crystal 53 that has grown up in the crucible 1 in the process (S30) is removed from the crucible 1 and sliced. More specifically, after finishing the heating in the process (S30), the crucible 1 is removed from the region surrounded by the induction heating coil 74. After that, the lid part 13 of the crucible 1 is removed. Then, the single crystal 53 is obtained from the lid part 13. The obtained single crystal 53 is sliced to form a principal surface that has an angle of 4° or smaller relative to a {0001} plane. As a result, with reference to FIG. 1, the silicon carbide substrate 9 having the carbon-surface-side principal surface 91 and the silicon-surface-side principal surface 92, whose off angle relative to the {0001} plane is smaller than or equal to 4°, is obtained.

Figure 3:
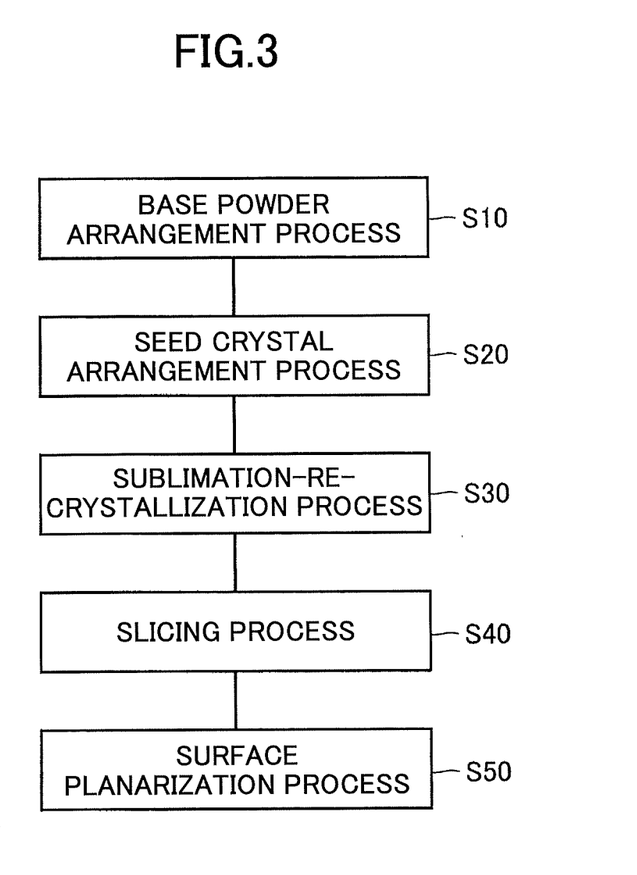
FIG. 3 is a flowchart illustrating a schematic method for manufacturing a silicon carbide substrate.

Next, as illustrated in FIG. 3, a surface planarization process is performed as a process (S50). In this process (S50), at least one of the carbon-surface-side principal surface 91 and the silicon-surface-side principal surface 92 of the silicon carbide substrate 9 obtained in the process (S40) is planarized. More specifically, planarization such as MP (Mechanical Polishing) and CMP (Chemical Mechanical Polishing) is performed on at least one of the carbon-surface-side principal surface 91 and the silicon-surface-side principal surface 92. Then, the silicon carbide substrate 9 of the present embodiment is obtained by performing cleaning and the like.

In the method for manufacturing the silicon carbide substrate of the present embodiment, as described above, the single crystal 53 grows while the carbon surface serves as the growth surface. Moreover, the amount of nitrogen gas introduced into the crucible 1 increases over time. This causes the nitrogen concentration in the region that has grown later to be higher than the nitrogen concentration in the region that has grown previously in the single crystal 53. Hence, the increase in lattice constant along with the temperature change is inhibited. Then, the obtained single crystal 53 is sliced in the process (S40). As a result, the silicon carbide substrate 9 in which the nitrogen concentration in the carbon-surface-side principal surface 91 is higher than the nitrogen concentration in the silicon-surface-side principal surface 92, and the difference between the Raman peak shift in the carbon-surface-side principal surface 91 and the Raman peak shift in the silicon-surface-side principal surface 92 is smaller than or equal to 0.2 cm$^{-1}$, can be manufactured.

It is understood that the embodiments and working examples disclosed herein are illustrative and non-restrictive in any respect. The scope of the present invention is defined by the terms of the claims, rather than the embodiments described above, and is intended to include any modifications within the scope and meaning equivalent to the terms of the claims.

DESCRIPTION OF THE REFERENCE NUMERALS 1 crucible
11 peripheral wall part
11A peripheral-wall-part coupling face
11B outer surface
12 bottom wall part
12A inner surface
12B outer surface
13 lid part
13A lid-part coupling face
13B outer surface
14 holding part
14A holding surface
21, 22, 23 heat insulating members
22A, 23A through hole
22B first principal surface
51 seed crystal
51A growth surface.
52 base powder
53 single crystal
71, 72 radiation thermometer
74 induction heating coil
9 silicon carbide substrate 91 carbon-surface-side principal surface
92 silicon-surface-side principal surface
99A, 99B, 99C measurement region
100 manufacturing device of a single crystal

The invention claimed is:

1. A silicon carbide substrate, comprising:
a carbon-side principal surface made of a crystal surface mainly composed of a carbon surface;
a silicon-side principal surface made of a crystal surface mainly composed of a silicon surface,
wherein the silicon carbide substrate has a 4H crystal structure and contains nitrogen,
wherein the silicon carbide substrate has a diameter in a range of 100 to 150 mm and a thickness in a range of 300 to 600 μm,
wherein an off angle of the carbon-side principal surface and the silicon-side principal surface relative to a {0001} plane is smaller than or equal to 4°, and
wherein a nitrogen concentration in the carbon-side principal surface is higher than a nitrogen concentration in the silicon-side principal surface, and a difference between a Raman peak shift of the carbon-side principal surface and a Raman peak shift of the silicon-side principal surface is smaller than or equal to 0.2 cm$^{-1}$.

2. The silicon carbide substrate as claimed in claim 1, wherein the nitrogen concentration in the carbon-side principal surface is higher than the nitrogen concentration in the silicon-side principal surface by $1\times10^{16}$ cm$^{-3}$.

3. The silicon carbide substrate as claimed in claim 1, wherein a difference between the nitrogen concentration in the carbon-side principal surface and the nitrogen concentration in the silicon-side principal surface is smaller than or equal to $1\times10^{17}$ cm$^{-3}$.

4. The silicon carbide substrate as claimed in claim 1, wherein the nitrogen concentration increases with decreasing distance from the carbon-side principal surface in a thickness direction.

* * * * *